United States Patent
Kalutarage et al.

(10) Patent No.: US 10,760,159 B2
(45) Date of Patent: Sep. 1, 2020

(54) METHODS AND APPARATUS FOR DEPOSITING YTTRIUM-CONTAINING FILMS

(71) Applicant: Applied Materials, Inc., Santa Clara, CA (US)

(72) Inventors: Lakmal C. Kalutarage, San Jose, CA (US); Mark Saly, Santa Clara, CA (US); Thomas Knisley, Monroe, MI (US); Benjamin Schmiege, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 275 days.

(21) Appl. No.: 15/649,584

(22) Filed: Jul. 13, 2017

(65) Prior Publication Data
US 2019/0017171 A1    Jan. 17, 2019

(51) Int. Cl.
| | | |
|---|---|---|
| *C23C 16/455* | (2006.01) | |
| *C23C 16/34* | (2006.01) | |
| *C23C 16/458* | (2006.01) | |
| *C23C 16/52* | (2006.01) | |
| *C23C 16/56* | (2006.01) | |

(52) U.S. Cl.
CPC ........ *C23C 16/45553* (2013.01); *C23C 16/34* (2013.01); *C23C 16/4584* (2013.01); *C23C 16/52* (2013.01); *C23C 16/56* (2013.01)

(58) Field of Classification Search
CPC .............. C23C 16/45553; C23C 16/34; C23C 16/4584; C23C 16/52; C23C 16/56
See application file for complete search history.

(56) References Cited

U.S. PATENT DOCUMENTS

| 7,351,658 | B2 | 4/2008 | Putkonen | |
|---|---|---|---|---|
| 2003/0072882 | A1* | 4/2003 | Niinisto | ............... C23C 16/40 |
| | | | | 427/255.28 |
| 2005/0020092 | A1* | 1/2005 | Putkonen | ............. C23C 16/405 |
| | | | | 438/778 |
| 2008/0020591 | A1* | 1/2008 | Balseanu | ............. C23C 16/345 |
| | | | | 438/761 |
| 2010/0260936 | A1 | 10/2010 | Hitoshi et al. | |
| 2013/0034947 | A1* | 2/2013 | Hong | ...................... H01L 45/04 |
| | | | | 438/384 |
| 2013/0203266 | A1 | 8/2013 | Hintze et al. | |
| 2015/0325447 | A1* | 11/2015 | Ogawa | ............. H01L 21/28088 |
| | | | | 438/680 |

(Continued)

FOREIGN PATENT DOCUMENTS

| CN | 102912302 A | * | 2/2013 |
|---|---|---|---|
| CN | 102912302 A1 | | 2/2013 |

OTHER PUBLICATIONS

PCT international Search Report and Written Opinion in PCT/US2018/041827 dated Nov. 30, 2018, 13 pages.

*Primary Examiner* — Kelly M Gambetta
(74) *Attorney, Agent, or Firm* — Servilla Whitney LLC

(57) ABSTRACT

Methods for depositing a yttrium-containing film through an atomic layer deposition process are described. Some embodiments of the disclosure utilize a plasma-enhanced atomic layer deposition process. Also described is an apparatus for performing the atomic layer deposition of the yttrium containing films.

20 Claims, 5 Drawing Sheets

(56) References Cited

U.S. PATENT DOCUMENTS

2016/0133277 A1* 5/2016 Cheng ................. C23C 8/02
                                                369/13.33
2016/0196980 A1* 7/2016 Degai ................. C23C 16/34
                                                438/608

* cited by examiner

METHODS AND APPARATUS FOR DEPOSITING YTTRIUM-CONTAINING FILMS

FIELD

Embodiments of the disclosure generally relate to methods for producing etch contrast materials. More particularly, embodiments of the disclosure are directed to methods for producing yttrium containing films through atomic layer deposition. Additional embodiments of the disclosure are directed to apparatus for performing atomic layer deposition of yttrium containing films on a substrate.

BACKGROUND

Etch selective films are used in patterning applications in semiconductor manufacturing processes. Films with different etch selectivity reduces the need for costly lithography methods that are commonly used for patterning. The ability to etch one film but not another film (or selectively etch one film relative to another film) uses less process steps than lithographic techniques.

Titanium nitride (TiN) is a common film used in microelectronics devices. During device manufacturing there is a need to etch TiN and not etch other materials in the device. To accomplish this, the materials that need to be protected from the TiN etch can be covered in a material that shows high etch contrast to TiN. There are not many known materials that show high dry etch selectivity to TiN using a halide based reactive ion (RI) etch. Common materials such as SiN, $TiO_2$, $HfO_2$ and $ZrO_2$ are not resistant enough to halide based etches to attain the high etch selectivities required for device manufacturing.

Therefore, there is a need in the art for new methods to deposit materials with high etch contrast to TiN.

SUMMARY

One or more embodiments of the disclosure are directed to methods of depositing a film. The methods comprise exposing a substrate to a yttrium precursor to form a yttrium species on the substrate. On or more of a nitrogen reactant or an oxygen reactant is exposed to the substrate to react with the yttrium species on the substrate to form one or more of a yttrium nitride or a yttrium oxide film. The yttrium precursor comprises a complex with a general formula $YR_1R_2R_3$, where $R_1$, $R_2$ and $R_3$ are independently selected from halides, carbonyl, cyclopentadienes, amines, acac, hfac, amidinates or diazadienes.

Additional embodiment of the disclosure is directed to methods comprising sequentially exposing a substrate to a yttrium precursor and a first nitrogen reactant to form a yttrium nitride film. The substrate is sequentially exposed to a silicon precursor and a second nitrogen reactant to form a silicon nitride film. The yttrium precursor comprises a yttrium species with a general formula $YR_1R_2R_3$, where $R_1$, $R_2$ and $R_3$ are independently selected from halides, carbonyls, cyclopentadienes, amines, acac, hfac, amidinates or diazadienes. The first nitrogen reactant comprises one or more of ammonia, nitrogen, hydrazine, argon, hydrogen, helium or plasmas thereof.

Further embodiments of the disclosure are directed to a processing chamber. The processing chamber comprises a susceptor assembly to support a plurality of substrates and rotate the plurality of substrate about a central axis. The susceptor assembly has a top surface with a plurality of recesses sized to hold the substrates. The processing chamber includes a gas distribution assembly having a front surface spaced from the top surface of the susceptor assembly to form a gap. The gas distribution assembly includes a plurality of gas ports and vacuum ports to provide a plurality of gas flows into the gap and a plurality of vacuum flows to remove gases from the gap. The plurality of gas ports and vacuum ports are arranged to form a plurality of process regions. Each process region is separated from adjacent process regions by a gas curtain. A controller is coupled to the susceptor assembly and the gas distribution assembly. The controller has one or more configurations. These configurations may include a first configuration to rotate the susceptor assembly about the central axis; a second configuration to provide a flow of a yttrium precursor to a process region; a third configuration to provide a flow of a silicon precursor to a process region; a fourth configuration to provide a flow of a nitrogen reactant to one or more of the process regions; or a fifth configuration to provide a treatment plasma in a process region. The yttrium precursor comprises a yttrium species with a general formula $YR_1R_2R_3$, where $R_1$, $R_2$ and $R_3$ are independently selected from halides, carbonyls, cyclopentadienes, amines, acac, hfac, amidinates or diazadienes. The silicon precursor comprises a species with a general formula $SiX_aR_{4-a}$, $Si(NRR')_aR''_{4-a}$, or a siloxane, where a is 0 to 4, X is a halide and R, R' and R'' are independently selected from H, alkyl or aryl. The nitrogen reactant comprises one or more of ammonia, nitrogen, hydrazine, argon, hydrogen, helium or plasmas thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
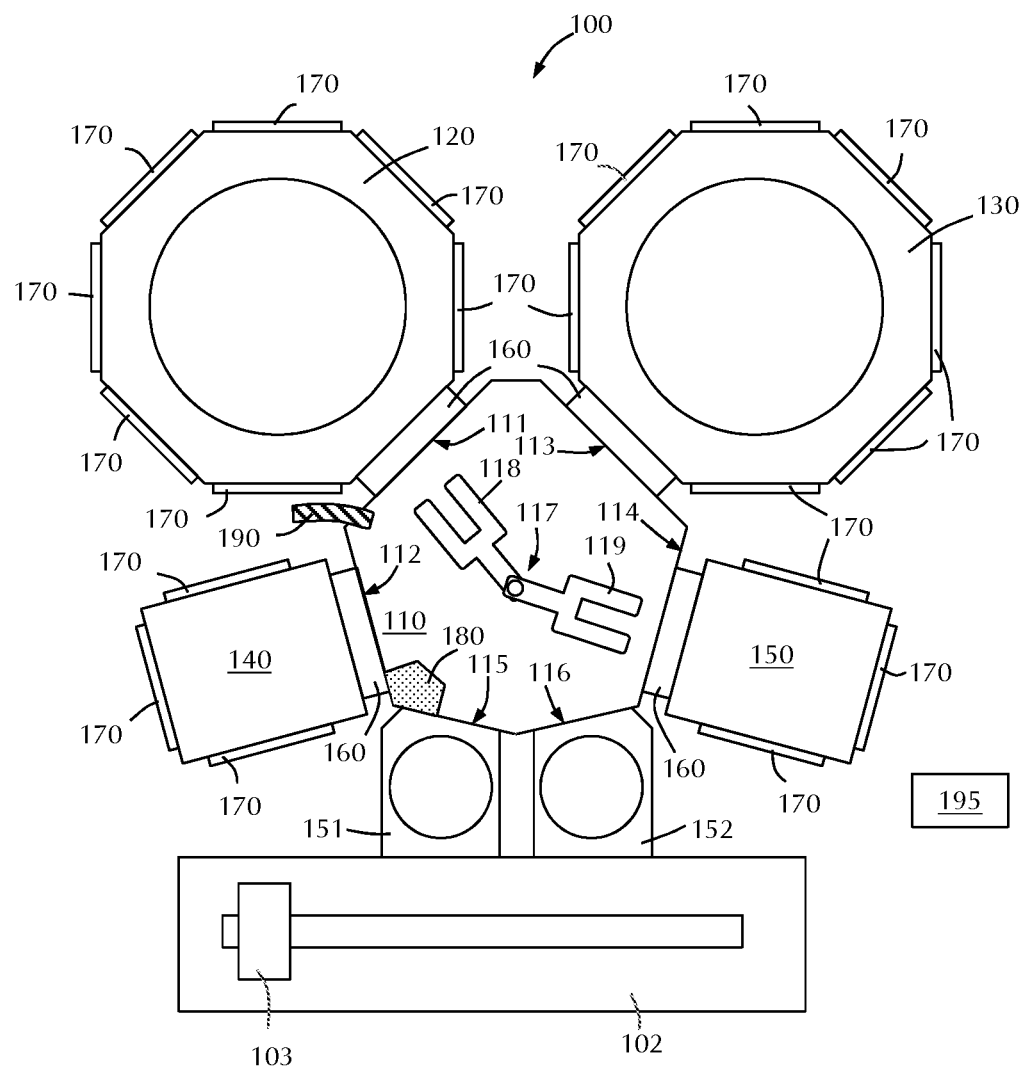
FIG. 1 shows a schematic view of a processing platform in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, is introduced into the processing chamber to purge the reaction zone or otherwise remove any residual reactive compound or reaction products or by-products from the reaction zone. Alternatively, the purge gas may flow continuously throughout the deposition process so that only the purge gas flows during the time delay between pulses of reactive compounds. The reactive compounds are alternatively pulsed until a predetermined film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one aspect of a spatial ALD process, a first reactive gas and second reactive gas (e.g., hydrogen radicals) are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

One or more embodiments of the disclosure advantageously provide methods of depositing films with high etch contrast to TiN. Some embodiments of the disclosure advantageously provide methods for forming yttrium-containing films with high etch selectivity. Some embodiments of the disclosure advantageously provide methods of doping yttrium into nitride films to increase etch selectivity. Some embodiments of the disclosure advantageously provide methods of doping yttrium into oxide films to increase etch selectivity. Some embodiments provide methods of doping yttrium into oxynitride films. Some embodiments of the disclosure advantageously provide new precursors for the atomic layer deposition of yttrium-containing films. Some embodiments of the disclosure advantageously provide barrier layers to prevent copper diffusion.

Doping yttrium to SiN film may give higher etch selectivity while keeping the ability to remove the film by chemical-mechanical planarization (CMP). Some embodiments of the disclosure provide methods to deposit the films by ALD and PEALD including, but not limited to, YN and yttrium doped SiN (with tunable Y concentration). Some embodiments provide yttrium precursors suitable for the ALD of YN and SiYN films.

One or more embodiments of the disclosure are directed to a method of depositing a nitride film. The method comprises exposing a substrate to a yttrium precursor to form a yttrium species on the substrate, and exposing the substrate to a nitrogen reactant to react with the yttrium species on the substrate to form a yttrium nitride film.

Some embodiments of the disclosure provide methods to deposit etch stop materials including one or more of YN or SiYN. In some embodiments, PEALD-YN and PEALD-SiN films are deposited to obtain SiYN films. The deposition process can be a two reactant (AB) or three reactant (ABC) process.

In some embodiments, a two reactant (AB) process has a pulse sequence including yttrium precursor exposure, purge, nitrogen reactant exposure, purge to deposit the YN film. In a time-domain ALD process, the yttrium precursor can be pulsed to the processing chamber followed by purging out the excess reactant/by-products. The yttrium precursor adsorbs onto the substrate (or reacts with the substrate surface) to leave a yttrium species. The surface is exposed to a nitrogen reactant (e.g., $NH_3$ or $N_2$) which reacts with surface chemisorbed Y-precursor. The nitrogen reaction can be a thermal process (i.e., without plasma) or a plasma-enhanced process. Excess nitrogen reactant, reaction products and/or by-products are purged from the processing chamber. In a spatial ALD process, the yttrium precursor and nitrogen reactant are provided to different parts of the processing chamber. The process regions are separated by gas curtains which may include purge gases and vacuum streams. The pulse sequence can be repeated to grow a film of a predetermined thickness.

Some embodiments provide a three reactant (ABC) process to form a yttrium containing film. PEALD of YN can be achieved by using the pulse sequence yttrium precursor, purge, nitrogen reactant, purge, treatment plasma, purge. Those skilled in the art will understand that the pulse sequence can be used in a time-domain process or a spatial process. The yttrium precursor can be pulsed into the chamber followed by purging out the excess reactant/by-products, or moving the substrate out of the yttrium process region of a spatial ALD chamber. The substrate can be exposed to a nitrogen reactant (e.g., $NH_3$) in a thermal process to react with the yttrium species. Excess nitrogen reactant can be purged from the process chamber or the substrate can be moved from the nitrogen reactant process region of the process chamber. The reactive sites on the substrate can be regenerated by using a treatment plasma exposure. The pulse sequence can be repeated to grow a film of a predetermined thickness.

The two reactant or three reactant processes can also include deposition of silicon nitride in addition to the yttrium nitride. The silicon precursor can be co-flowed with the yttrium precursor or can be a separate precursor exposure. The SiYN can be formed as a homogeneous film or as a laminate of SiN and YN layers. The silicon nitride deposition can be a thermal process or a plasma-enhanced process.

In some embodiments, a yttrium oxide film is formed. The two and three reactant processes can be altered to use an oxygen reactant instead of a nitrogen reactant. In some embodiments, the oxygen reactant is added to the nitrogen reactant to form an oxynitride film.

In some embodiments, the yttrium precursor comprises a complex with a general formula $YR_1R_2R_3$, where $R_1$, $R_2$ and $R_3$ are independently selected from halides, carbonyl, cyclopentadienes, amines, acetylacetonate (acac), hexafluoroacetylacetonate (hfac), amidinates or diazadienes. In some embodiments, at least one of the R groups is a halide. In some embodiments, at least one of the R groups is a carbonyl. In some embodiments, at least one of the R groups is a cyclopentadiene. In some embodiments, one of the R groups is a cyclopentadiene. In some embodiments, two of the R groups are cyclopentadienes. In some embodiments, each of the R groups is a cyclopentadiene.

As used in this specification and the appended claims, the term "cyclopentadienes" includes substituted and unsubstituted rings. The cyclopentadiene ligands may be alkyl substituted or amino substituted. Alkyl substituents for the cyclopentadiene ligand include C1-C4 alkyl groups. Amino substituents for the cyclopentadiene ligand include groups with the general formula $-NR_2$ where R is a C1-C4 alkyl group. As used in this manner, the letter "C" followed by a numeral (e.g., "C4") means that the substituent comprises the specified number of carbon atoms (e.g., C4 comprises four carbon atoms). The alkyl groups can be straight chain groups (e.g. n-butyl) or branched groups (e.g. t-butyl). In some embodiments, the cyclopentadiene ligand is unsubstituted (i.e., $C_5H_5$). In some embodiments, the cyclopentadiene ligand has a formula $C_5H_4R'$, $C_5H_3R'_2$, $C_5H_2R'_3$, $C_5HR'_4$ or $CR'_5$, where each R' is independently a C1-C4 alkyl group or amino group. In some embodiments with more than one R' group, each of the R' groups are the same substituent. In some embodiments, with more than one R' group, there are at least two different substituents.

In the yttrium precursor, the amine ligands can be C1-C4 alkyl substituted. Similarly, amidinate ligands can have C1-C4 alkyl groups on one or both of the nitrogen atoms.

The diazadiene ligands can adopt several resonance forms when binding to a yttrium atom as depicted in scheme (I).

(I)

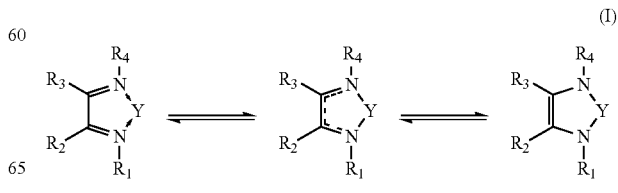

Each of these resonance forms imparts a different electronic charge on the yttrium metal center when bonded together in a metal complex. The form on the left containing two double bonds (the diene) is a neutral, nonionic ligand (DAD0). The resonance form in the center of scheme (I) contains a radical resonance structure and is a monoanionic ligand (DAD1). The resonance form on the right of scheme (I) containing a single double bond is a dianionic ligand (DAD2). For each of these resonance forms, $R_1$ and $R_4$ are independently selected from the group consisting of C1-C4 alkyl or amino groups; each of $R_2$ and $R_3$ are independently selected from H or C1-C4 alkyl or amino groups. As used in this manner, C1-C4 amino groups are directly bonded to the diazadiene ligand and may contain C1-C4 alkyl substituent groups that can be straight chain groups (e.g. n-butyl) or branched groups (e.g. t-butyl).

In some embodiments, the yttrium precursor has a general formula of $Y(DAD0)_aQ_dZ_e$ wherein DAD0 is a neutral diazadiene based ligand

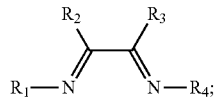

R1 and R4 are independently selected from the group consisting of C1-C4 alkyl and amino groups; each of R2 and R3 are independently selected from the group consisting of H, C1-C3 alkyl, or amino groups; Q is an anionic ligand; Z is a neutral ligand; and a is 1-3, d is 0-3, and e is 0-8. In some embodiments, Z is CO and a is not 1. In some embodiments, Z is not based on DAD.

In some embodiments, the yttrium precursor comprises a coordination complex of the general formula $Y(DAD1)_bQ_dZ_e$, wherein DAD1 is an anionic diazadiene radical based ligand

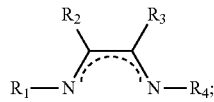

R1 and R4 are independently selected from the group consisting of C1-C4 alkyl and amino groups; each of R2 and R3 are independently selected from the group consisting of H, C1-C3 alkyl, or amino groups; Q is an anionic ligand; Z is a neutral ligand; and b is 1-3, d is 0-3 and e is 0-8. In some embodiments, d and e are not both 0. In some embodiments, Q is not based on DAD or a divalent DAD based ligand. In some embodiments, Z is not based on DAD or a neutral DAD based ligand.

In some embodiments, the yttrium precursor comprises a metal coordination complex of the general formula $Y(DAD2)_cQ_dZ_e$, wherein DAD2 is a dianionic diazadiene based ligand

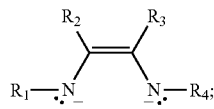

R1 and R4 are independently selected from the group consisting of C1-C4 alkyl and amino groups; each of R2 and R3 are independently selected from the group consisting of H, C1-C3 alkyl, or amino groups; Q is an anionic ligand; Z is a neutral ligand; and c is 1-3, d is 0-3 and e is 0-8. In some embodiments, Q is not based on DAD or a univalent DAD based ligand. In some embodiments, Z is not based on DAD or a neutral DAD based ligand.

The nitrogen reactant can be any suitable nitrogen species that can react with the yttrium species or silicon species on the substrate. In some embodiments, the nitrogen reactant comprises one or more of nitrogen, NO, $NO_2$, $N_2O$, ammonia, hydrazine or hydrazine derivatives. In some embodiments, the nitrogen reactant consists essentially of ammonia. As used in this regard, the term "consists essentially of ammonia" means that the reactive species in the nitrogen reactant is greater than or equal to about 95%, 98% or 99% of the stated species. In some embodiments, the nitrogen reactant is co-flowed with an inert, diluent or carrier gas. Suitable inert, diluent or carrier gases include, but are not limited to, argon, hydrogen, helium and nitrogen. In some embodiments, the nitrogen reactant comprises, or consists essentially of, ammonia and the nitrogen reactant is mixed with one or more of $N_2$, Ar, $H_2$ or He.

In some embodiments, the nitrogen reactant comprises a reactant plasma. The reactant plasma of some embodiments comprises a plasma one or more of nitrogen, ammonia, hydrazine or hydrazine derivatives. The reactant plasma may also include diluent or carrier gases, including but not limited to nitrogen, argon, hydrogen, or helium and plasmas thereof. The reactant plasma can be a direct plasma or remote plasma. The reactant plasma can be a conductively coupled plasma (CCP) or inductively coupled plasma (ICP).

The treatment plasma, as used herein, is a plasma exposure that is separate from the nitrogen reactant. The deposition process can be thermal or plasma enhanced and the addition of a treatment plasma can be used with either. In some embodiments, the treatment plasma comprises one or more of plasma activated Ar, $N_2$, $H_2$, He, or combination thereof. The treatment plasma can be a direct plasma or remote plasma. The treatment plasma can be a conductively coupled plasma (CCP) or inductively coupled plasma (ICP).

In some embodiments, the method includes exposing the yttrium-nitride film, the silicon-yttrium nitride film and/or the silicon nitride film on the substrate to a treatment plasma to change a property of the film. In some embodiments, the treatment plasma comprises one or more of nitrogen, argon, hydrogen or helium. Film properties which can be modified by the treatment plasma include, but are not limited to, density, wet etch rate and refractive index.

In some embodiments, silicon is incorporated into the film to result in a silicon nitride or silicon yttrium nitride film. The substrate is exposed to a yttrium precursor to form a yttrium species on the substrate. The substrate can then be exposed to a silicon precursor so that the yttrium species on the substrate is changed to a silicon-yttrium species. After exposure to the nitrogen reactant, a silicon-yttrium nitride film is formed. The silicon precursor can be exposed to the substrate before or after the yttrium precursor so that a silicon species is formed on the surface and changed to the silicon-yttrium species. In some embodiments, the silicon and yttrium precursors are co-flowed to form the silicon-yttrium species on the surface. In some embodiments, a yttrium nitride film is formed on the substrate and then exposed to the silicon precursor to form a silicon species on the substrate. After exposure to the nitrogen reactant, a silicon nitride film is formed on the yttrium nitride film already on the substrate.

Suitable silicon precursors include, but are not limited to, siloxanes, silyl halides having the general formula $SiX_aR_{(4-a)}$ where X is F, Cl, Br, I and R is H, alkyl or aryl, or silyl amides having the general formula $Si(NRR')_aR''_{(4-a)}$ where R, R', and R" are H, alkyl or aryl. Examples of silyl halides include, but are not limited to, dichlorosilane (DCS), hexachloridisilane (HCDS), trichlorosilane (TCS) and $SiCl_4$. Examples of silyl amides include, but are not limited to, bis(diethylamino)silane (BDEAS), bis(tert-butylamino) silane (BTBAS), tetrakis(dimethylamino)silane (TDMAS). In some embodiments, the silicon precursor comprises a species with a general formula $Si_nX_aR_{2n+2-a}$, where n is 1 to 4, a is 0 to 2n+2, X is a halide and R, R' and R" are independently selected from H, C1-C6 alkyl or aryl. Suitable siloxanes include, but are not limited to, hexachlorodisiloxane (HCDSO) and octachlorotrisiloxane (OCTSO).

One or more embodiments of the disclosure are directed to a method comprising sequentially exposing a substrate to a yttrium precursor and a first nitrogen reactant to form a yttrium nitride film, and sequentially exposing the substrate to a silicon precursor and a second nitrogen reactant to form a silicon nitride film. The first and second nitrogen reactants can be the same or different. The concentrations, plasma states (i.e., no plasma or plasma) or chemical composition of the first nitrogen reactant is independent of the second nitrogen reactant. In some embodiments, the first nitrogen reactant and the second nitrogen reactant are the same species. In some embodiments, the first nitrogen reactant and the second nitrogen reactant are the same.

In some embodiments, the method also includes repeating the formation of the yttrium nitride film and/or the silicon nitride film to form a yttrium nitride film and/or silicon-yttrium nitride film of a predetermined thickness. The predetermined thickness of the yttrium nitride or silicon-yttrium nitride film can vary depending on the use of the film. For example, a yttrium containing etch contrast film may have a different thickness than a yttrium containing copper barrier layer. In some embodiments, the yttrium containing film is used as a diffusion barrier and has a thickness in the range of about 1 Å to about 100 Å, or in the range of about 5 Å to about 50 Å. In some embodiments, the yttrium containing film is used as an etch contrast layer and has a thickness in the range of about 10 Å to about 1,000 Å, or in the range of about 100 Å to about 800 Å, or in the range of about 200 Å to about 600 Å, or in the range of about 300 Å to about 500 Å.

Some embodiments of the disclosure provide methods of forming conformal films on a substrate. A conformal film can be deposited on some or all of the surfaces of the substrate. For example, a conformal film may be deposited on a substrate that has at least one surface feature (e.g., a trench or via). A conformal film has the same thickness at the top of the feature as the bottom of the feature. In some embodiments, the conformality of the film is measured as the thickness at the top of the feature relative to the thickness at the bottom of the feature and is greater than or equal to about 90%, 91%, 92%, 93%, 94%, 95%, 96%, 97%, 98%, 99% or about 100%.

In some embodiments, the yttrium precursor, the silicon precursor and the nitrogen reactant(s) are provided to the process chamber. The precursors and reactants can be provided as pure compounds, or may be diluted by a diluent or carrier gas. The reactive compound (including any diluent or carrier gas) supplied to the chamber is referred to as a process gas.

Described below is an embodiment of a method of the disclosure wherein a deposited film is formed on the surface of a substrate using an atomic layer deposition (ALD) process. The method described below is exemplary and should not be construed as limiting. The methods of the disclosure may contain additional process steps to those described below.

Each process gas may be supplied under different parameters than other process gasses. A process gas may be provided in one or more pulses or continuously. The flow rate of a process gases can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. A process gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to a process gas may be any suitable amount of time necessary to allow the formation of an adequate nucleation layer or reaction atop the substrate surface. For example, a process gas may be flowed into the process chamber for a period of about 0.1 seconds to about 90 seconds. In some time-domain ALD processes, a process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as a process gas. The inert gas may be mixed with a process gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like.

The temperature of the substrate during deposition can be controlled, for example, by setting the temperature of the substrate support or susceptor. In some embodiments the substrate is held at a temperature in the range of about 100° C. to about 600° C., or in the range of about 200° C. to about 525° C., or in the range of about 300° C. to about 475° C., or in the range of about 350° C. to about 450° C. In one or more embodiments, the substrate is maintained at a temperature less than about 475° C., or less than about 450° C., or less than about 425° C., or less than about 400° C., or less than about 375° C.

In addition to the foregoing, additional process parameters may be regulated while exposing the substrate to a process gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

After exposing the substrate to one process gas, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of greater than 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess process gases and/or excess reaction byproducts from the process chamber to prevent unwanted gas phase reactions. For example, the flow of inert gas may remove excess process gas from the process chamber, preventing a reaction between the yttrium precursor and a subsequent process gas.

Then the substrate is exposed to a second process gas for a second period of time. The second process gas may reacts with the species on the substrate surface to create a deposited film. The second process gas may be supplied to the substrate surface at a flow rate greater than the first process gas. In one or more embodiments, the flow rate is greater than about 1 time that of the first process gas, or about 100 times that of the first process gas, or in the range of about 3000 to 5000 times that of the first process gas. The second process gas can be supplied, in time-domain ALD, for a time in the range of about 1 sec to about 30 sec, or in the range of about 5 sec to about 20 sec, or in the range of about 10 sec to about 15 sec. The second process gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 475° C., or at a temperature about the same as that of the substrate during exposure to the first process gas.

The process chamber may again be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the embodiment of the processing method described above includes only two pulses of reactive gases, it will be understood that this is merely exemplary and that additional pulses of process gases may be used. The pulses can be repeated in their entirety or in part. The cycle can be repeated to form a film of a predetermined thickness.

Referring to the Figures, FIG. 1 shows a processing platform 100 in accordance with one or more embodiment of the disclosure. The embodiment shown in FIG. 1 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The transfer station 110 shown has a first side 111, a second side 112, a third side 113, a fourth side 114, a fifth side 115 and a sixth side 116. Although six sides are shown, those skilled in the art will understand that there can be any suitable number of sides to the transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A batch processing chamber 120 can be connected to a first side 111 of the central transfer station 110. The batch processing chamber 120 can be configured to process x wafers at a time for a batch time. In some embodiments, the batch processing chamber 120 can be configured to process in the range of about four (x=4) to about 12 (x=12) wafers at the same time. In some embodiments, the batch processing chamber 120 is configured to process six (x=6) wafers at the same time. As will be understood by the skilled artisan, while the batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
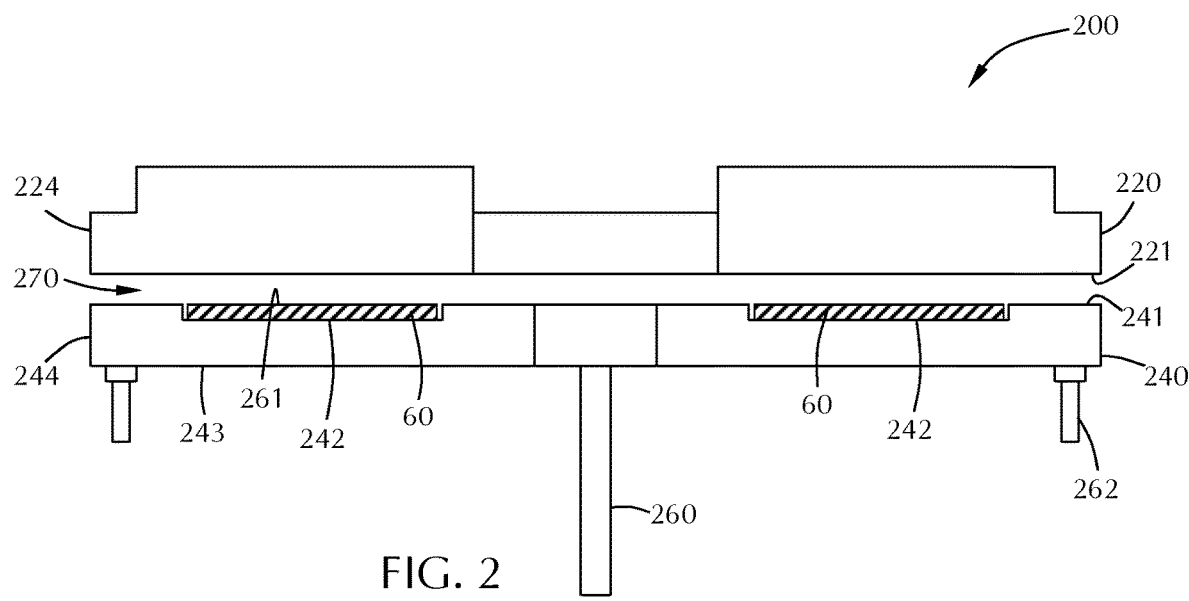
FIG. 2 shows a cross-sectional view of a batch processing chamber in accordance with one or more embodiment of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels.

As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
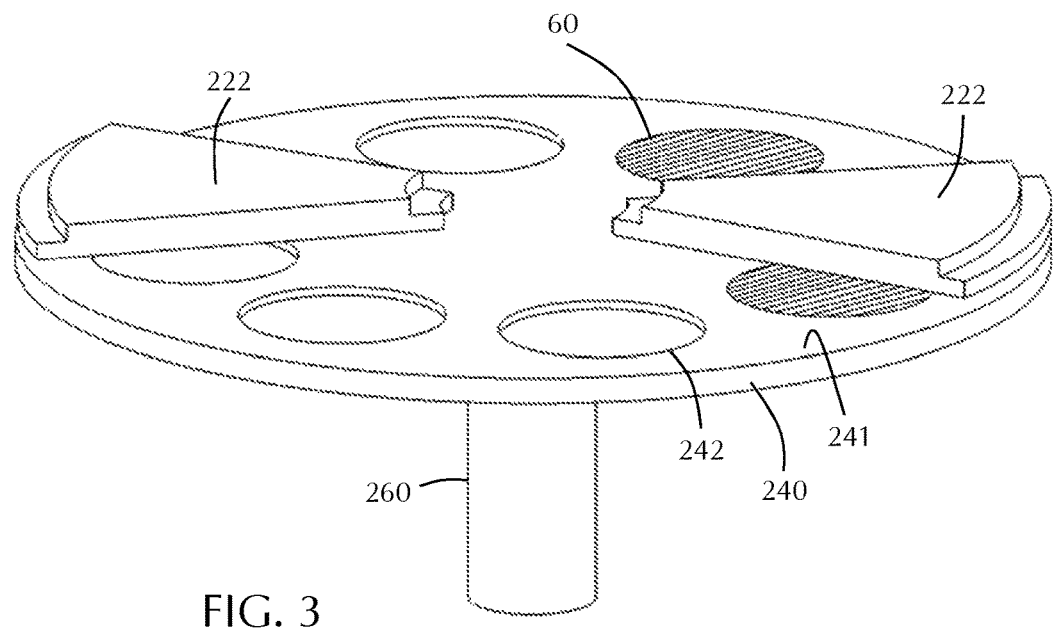
FIG. 3 shows a partial perspective view of a batch processing chamber in accordance with one or more embodiment of the disclosure.

In some embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

A susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The recess 242 can be any suitable shape and size depending on the shape and size of the substrates 60 being processed. In the embodiment shown in FIG. 2, the recess 242 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In some embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In some embodiments, there are a sufficient number of pie-shaped injector units 222 to form a shape conforming to the shape of the susceptor assembly 240. In some embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
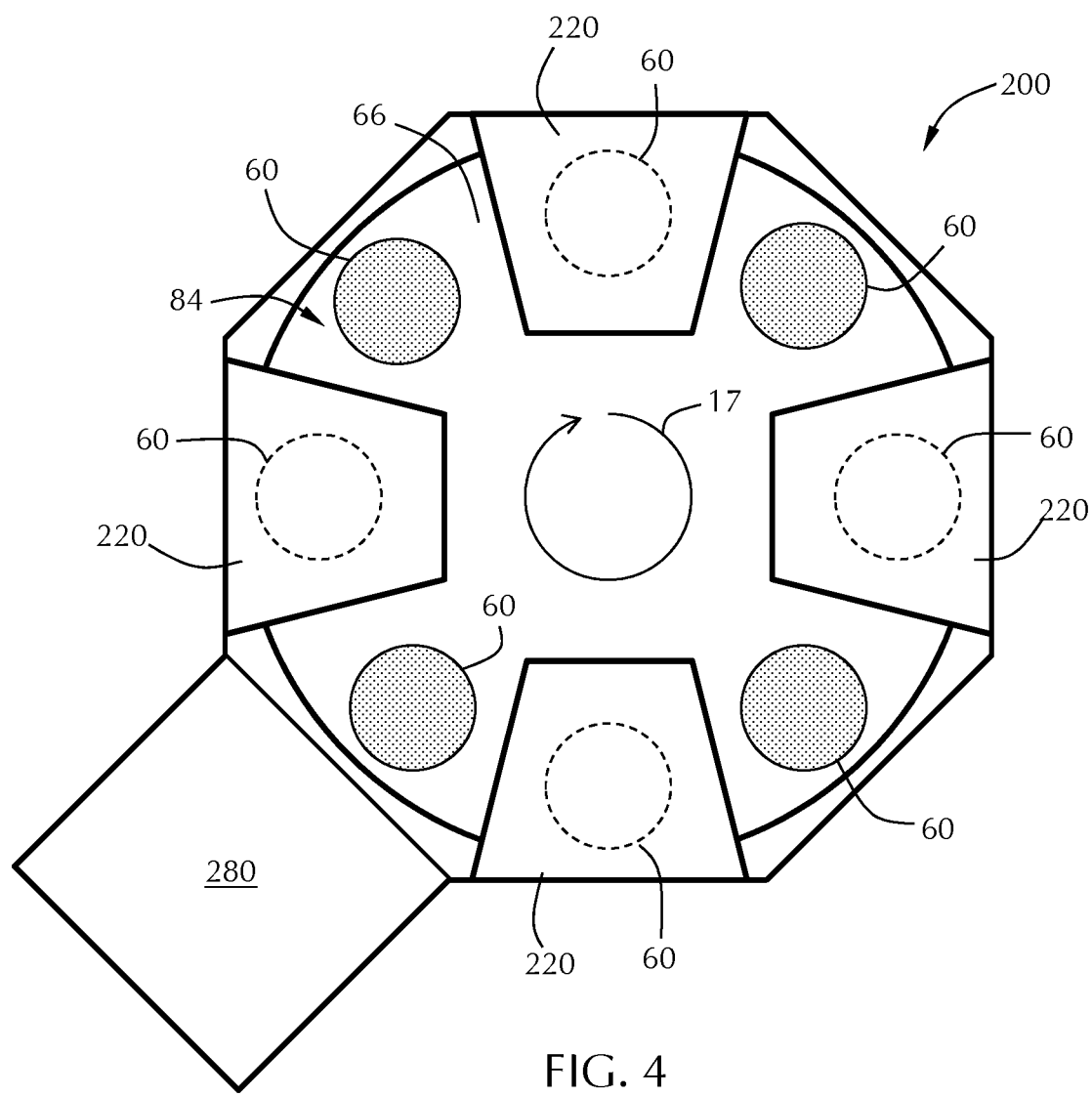
FIG. 4 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiment shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station. This chamber 280 is connected to a side of the processing chamber 200 to allow, for example the substrates (also referred to as substrates 60) to be loaded/unloaded from the chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 5:
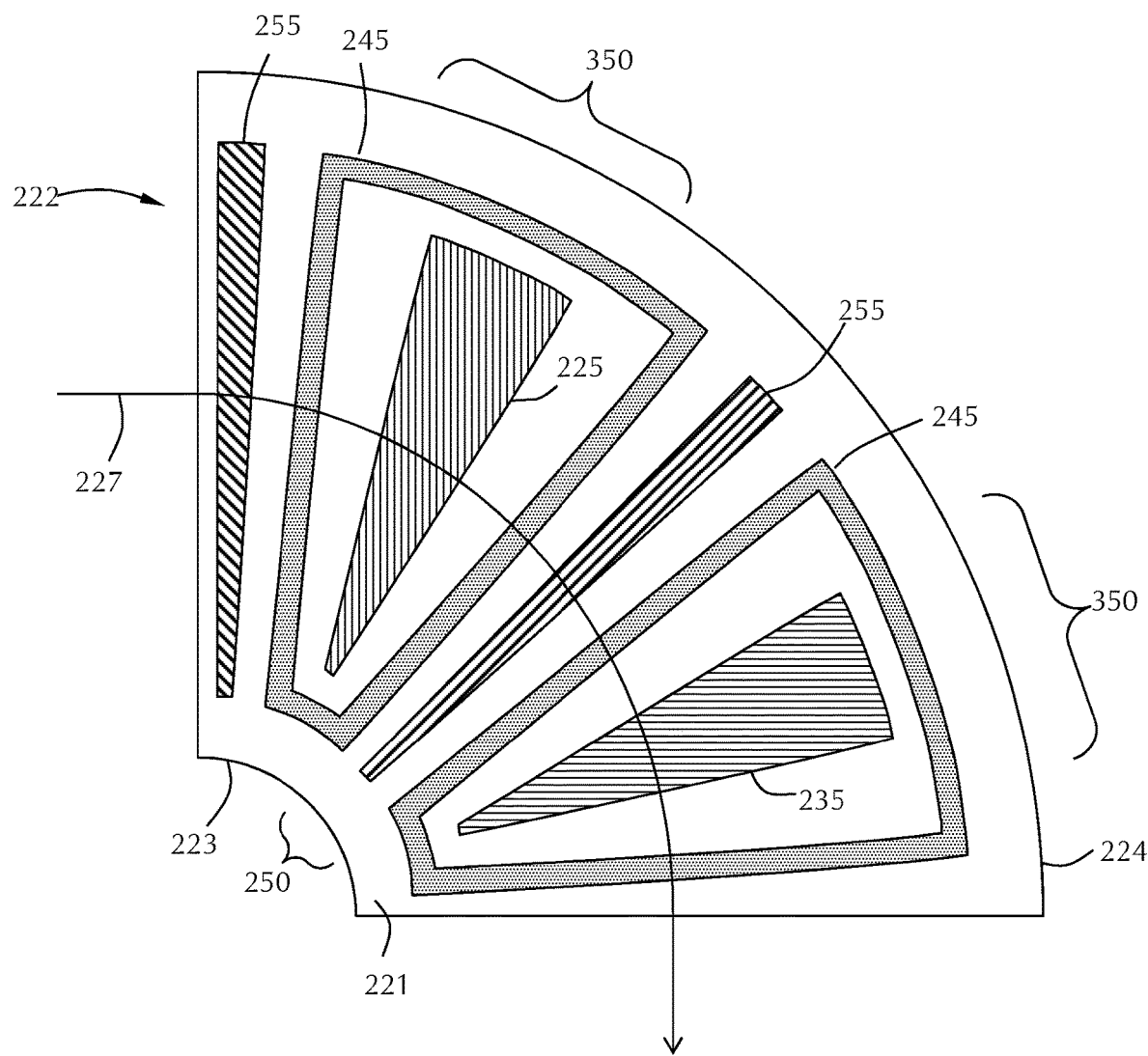
FIG. 5 shows a schematic view of a portion of a wedge shaped gas distribution assembly for use in a batch processing chamber in accordance with one or more embodiment of the disclosure.
Figure 6:
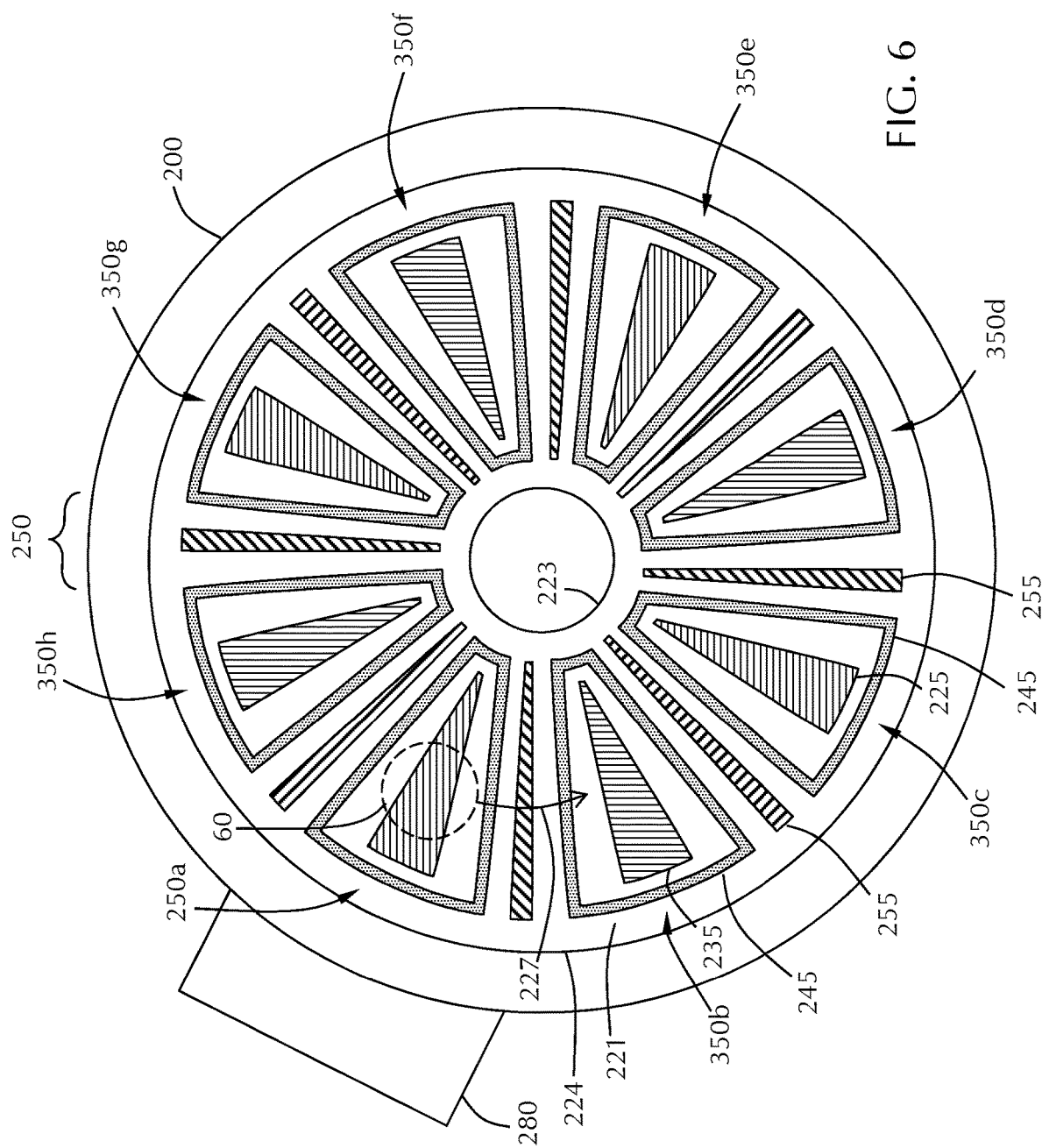
FIG. 6 shows a schematic view of a batch processing chamber in accordance with one or more embodiment of the disclosure.

FIG. 5 shows a sector or portion of a gas distribution assembly 222, which may be referred to as an injector unit. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiment may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiment shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas 225 and the second reactive gas 235 to form a layer. The injector unit 222 shown makes a quarter circle but could be larger or smaller. The gas distribution assembly 220 shown in FIG. 6 can be considered a combination of four of the injector units 222 of FIG. 3 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiment shown in FIG. 6 makes up eight separate process regions 350 with eight separate gas curtains 250 between. A processing chamber can have at least two process regions. In some embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface 280 (as shown in FIG. 4), which can be, for example, a load lock chamber, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution plate 220. The substrate 60 is loaded via the factory interface 280 into the processing chamber 200 onto a substrate support or susceptor assembly (see FIG. 4). The substrate 60 can be shown positioned within a process region because the substrate is located adjacent the first reactive gas port 225 and between two gas curtains 250a, 250b. Rotating the substrate 60 along path 227 will move the substrate counter-clockwise around the processing chamber 200. Thus, the substrate 60 will be exposed to the first process region 350a through the eighth process region 350h, including all process regions between.

Some embodiments of the disclosure are directed to a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a treatment chamber 140 connected to a second side 112 of the central transfer station 110. The treatment chamber 140 of some embodiments is configured to expose the wafers to a process to treat the wafers before and/or after processing in first batch processing chamber 120. The treatment chamber 140 of some embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In some embodiments, the processing platform further comprises a second batch processing chamber 130 connected to a third side 113 of the central transfer station 110. The second batch processing chamber 130 can be configured similarly to the batch processing chamber 120, or can be configured to perform a different process or to process different numbers of substrates.

The second batch processing chamber 130 can be the same as the first batch processing chamber 120 or different. In some embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In some embodiments, the first batch processing chamber 120 and the second batch processing chamber 130 are configured to have one or more of different numbers of wafers (x not equal to y), different batch times, or both.

In the embodiment shown in FIG. 1, the processing platform 100 includes a second treatment chamber 150 connected to a fourth side 114 of the central transfer station 110. The second treatment chamber 150 can be the same as the treatment chamber 140 or different.

The processing platform 100 can include a controller 195 connected to the robot 117 (the connection is not shown). The controller 195 can be configured to move wafers between the pre-clean chamber 140 and the first batch processing chamber 120 with a first arm 118 of the robot 117. In some embodiments, the controller 195 is also configured to move wafers between the second single wafer processing chamber 150 and the second batch processing chamber 130 with a second arm 119 of the robot 117.

In some embodiments, the controller 195 is connected to the susceptor assembly 240 and the gas distribution assembly 220 of a processing chamber 200. The controller 195 can be configured to rotate 17 the susceptor assembly 240 about a central axis. The controller can also be configured to control the gas flows in the gas ports 225, 235, 245, 255. In some embodiments, the first reactive gas port 225 provides a flow of a yttrium precursor. In some embodiments, the second reactive gas port 235 provides a flow of a silicon precursor. In some embodiments, other gas ports (not labelled) may provide a flow of nitrogen reactant or a treatment plasma. The first reactive gas port 225, the second reactive gas port 235 and the other reactive gas ports (not labelled) may be arranged in any processing order.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

In some embodiments, the controller 195 is configured to move wafers between the first buffer station 151 and one or more of the treatment chamber 140 and the first batch processing chamber 120 using the first arm 118 of the robot 117. In some embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the transfer chamber 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the platform 100. A robot 103 within the factory interface 102 can be moved the wafers or cassettes into and out of the buffer stations 151, 152. The wafers or cassettes can be moved within the platform 100 by the robot 117 in the central transfer station 110. In some embodiments, the factory interface 102 is a transfer station of another cluster tool.

In some embodiments, the processing platform 100 or batch processing chamber 120 is connected to a controller. The controller can be the same controller 195 or a different controller. The controller can be coupled to the susceptor assembly and the gas distribution assembly of the batch processing chamber 120 and has one or more configurations.

The configurations can include, but are not limited to, a first configuration to rotate the susceptor assembly about the central axis, a second configuration to provide a flow of a yttrium precursor to a process region, the yttrium precursor comprising a yttrium species with a general formula $YR_1R_2R_3$, where $R_1$, $R_2$ and $R_3$ are independently selected from halides, carbonyls, cyclopentadienes, amines, acac, hfac, amidinates or diazadienes, a third configuration to provide a flow of a silicon precursor to a process region, the silicon precursor comprising a species with a general formula $Si_nX_aR_{2n+2-a}$, $Si(NRR')_aR''_{4-a}$, or a siloxane, where n is 1 to 4, a is 0 to 2n+2, X is a halide and R, R' and R" are independently selected from H, alkyl or aryl, a fourth configuration to provide a flow of a nitrogen reactant to one or more of the process regions, the nitrogen reactant comprising one or more of ammonia, nitrogen, hydrazine, argon, hydrogen, helium or plasmas thereof, or a fifth configuration to provide a treatment plasma in a process region.

In some embodiments of the disclosure, a silicon-yttrium nitride film is deposited or formed on a substrate surface as a laminate of yttrium nitride and silicon nitride layers. The number of layers of yttrium nitride and silicon nitride can vary to control the amount of yttrium or silicon in the silicon-yttrium nitride film. In some embodiments, a first number of cycles of yttrium nitride are deposited by a two reactant process or three reactant process. A second number of cycles of silicon nitride are deposited by a two reactant process or three reactant process. One or more of the first number of cycles or second number of cycles can be repeated to form the silicon-yttrium nitride film. Either of the yttrium nitride or silicon nitride films can be deposited first.

In some embodiments, a PEALD SiYN film is deposited. A Y precursor can be pulsed to the chamber followed by purging out the excess reactant/by-products. Then the surface is exposed to Si-precursor, which reacts with chemisorbed Y-precursor. Then the surface is exposed to plasma activated $NH_3$ or $NH_3$ followed by plasma activation (Ar, $N_2$, $H_2$, He plasma) to form SiYN film. Repeating this sequence can generate a SiYN film of a predetermined thickness. The silicon precursor or yttrium precursor can be exposed to the substrate first.

In one or more embodiments, a SiYN film can be formed by thermal ALD. The substrate is exposed to a Y precursor followed by a Si precursor, with purging between, or by moving to different process regions. The silicon precursor can react with the chemisorbed Y-precursor, or vice versa if the Si precursor is first. The surface can then be exposed to $NH_3$ (without plasma activation). The sequence can be repeated to form a SiYN film of a predetermined thickness.

In some embodiments, a SiYN film can be formed by a mixture of PEALD and thermal ALD processes. A YN PEALD or thermal process can be mixed with a SiN PEALD or thermal process. The number of cycles of each of the YN and SiN processes can be varied to control the composition of the SiYN film.

EXAMPLES

A YN film was deposited by sequential exposure to a yttrium precursor, a purge gas, a reactant plasma and a purge gas. The yttrium precursor used was $Y(Et-Cp)_2(N,N-diisopropyl\ amidinate)$. Each step was separated by a 10 s Ar purge. The reactant plasma was a 1:1 $NH_3$:Ar mixture. The pulse lengths for the yttrium precursor and plasma exposures were 6 s and 5 s, respectively. The yttrium precursor ampoule was maintained at 95° C. and the substrate was kept at 350° C. The YN film had a growth per cycle (GPC) of 0.42 Å/min and 0.97 Å/min wet etch rate (WER) in dilute HF (1:100). The YN film did not etch in water. Lowering the temperature increased the GPC as well as the C content in the film.

ALD cycles were carried out as alternating YN and SiN cycles (two reactant YN/two reactant SiN). Both cycles utilized a reactant plasma of 1:1 $NH_3$:Ar. Each step of the sequence was separated by a 10 s Ar purge. The pulse lengths for the yttrium precursor ($Y(Et-Cp)_2(N,N-diisopropyl\ amidinate)$), plasma, trichlorosilane (TCS), and plasma were 6 s, 5 s, 1 s, and 10 s, respectively. The yttrium precursor ampoule was kept at 95° C. and TCS ampoule was maintained at room temperature. Depositions were carried out at 350° C. substrate temperature. The GPC was higher for mixed films than that of individual films. The WER of mixed films were between that of individual SiN and YN films. The mixed films had atomic compositions in between the compositions of individual SiN and YN films.

A YO film was deposited by sequential exposure to a yttrium precursor, a purge gas, a reactant plasma and a purge gas. The yttrium precursor was $Y(Et-Cp)_2(N,N-diisopropyl\ amidinate)$. The reactant plasma was a 1:1 $O_2$:Ar mixture. Each step was separated by a 10 s Ar purge. The yttrium precursor ampoule was maintained at 95° C. and the substrate was kept at 350° C.

YO films were deposited by sequential exposure to a yttrium precursor, a purge gas, an oxygen reactant and a purge gas. The yttrium precursor used was $Y(Et-Cp)_2(N,N-diisopropyl\ amidinate)$. The oxygen reactants were 1:1 mixtures of $O_2$/Ar, $O_3$/Ar and $H_2O$/Ar for different films. Each step was separated by a 10 s Ar purge. The yttrium precursor ampoule was maintained at 95° C. and the substrate was kept at 350° C.

The YO films had growth per cycles (GPCs) of about 1.5 Å/min and a wet etch rate (WER) less than 1 Å/min in dilute HF (1:100) and water. The dry etch rate was measured using a halide based etch and divided by ALD-TiN etch rate to obtain the etch selectivity. Some of the films did not show any etching under these conditions. Dry etch selectivity of YN/SiYN films ranged from 12 to infinity. Dry etch selectivity of YO/SiYO films ranged from 23 to infinity. For the YN/SiYN films and the YO/SiYO films, when Si/Y ratio decreased, etch selectivity increased.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
   exposing a substrate to a yttrium precursor and a silicon precursor to form a silicon-yttrium species on the substrate, the yttrium precursor comprising a complex with a general formula $YR_1R_2R_3$, where $R_1$, $R_2$ and $R_3$ are independently selected from halides, carbonyl, cyclopentadienes, amines, acac, hfac, amidinates or diazadienes; and
   exposing the substrate to a nitrogen reactant to react with the silicon-yttrium species on the substrate to form a silicon-yttrium nitride film.

2. The method of claim 1, wherein the nitrogen reactant comprises one or more of nitrogen, ammonia or hydrazine.

3. The method of claim 1, wherein the nitrogen reactant comprises a reactant plasma.

4. The method of claim 1, wherein the silicon precursor comprises a species with a general formula $Si_nX_aR_{2n+2-a}$, $Si(NRR')_aR''_{4-a}$, or a siloxane, where n is 1 to 4, a is 0 to 2n+2, X is a halide and R, R' and R'' are independently selected from H, alkyl or aryl.

5. The method of claim 1, wherein the yttrium precursor and the silicon precursor are exposed to the substrate at the same time.

6. The method of claim 1, wherein the yttrium precursor and the silicon precursor are exposed to the substrate sequentially.

7. The method of claim 4, further comprising exposing the silicon-yttrium nitride film on the substrate to a treatment plasma to change a property of the film.

8. The method of claim 7, wherein the treatment plasma comprises one or more of nitrogen, argon, hydrogen, or helium.

9. A method comprising:
   sequentially exposing a substrate to a yttrium precursor and a first nitrogen reactant to form a yttrium nitride film, the yttrium precursor comprises a yttrium species with a general formula $YR_1R_2R_3$, where $R_1$, $R_2$ and $R_3$ are independently selected from halides, carbonyls, cyclopentadienes, amines, acac, hfac, amidinates or diazadienes and at least one of $R_1$, $R_2$ or $R_3$ is a diazadiene, the first nitrogen reactant comprising one or more of ammonia, nitrogen, hydrazine, or plasmas thereof; and
   sequentially exposing the substrate to a silicon precursor and a second nitrogen reactant to form a silicon nitride film.

10. The method of claim 9, wherein the silicon precursor comprises a species with a general formula $Si_nX_aR_{2n+2-a}$, $Si(NRR')_aR''_{4-a}$, or a siloxane, where n is 1 to 4, a is 0 to 2n+2, X is a halide and R, R' and R'' are independently selected from H, alkyl or aryl.

11. The method of claim 9, wherein the second nitrogen reactant comprises one or more of ammonia, nitrogen, hydrazine, or plasmas thereof.

12. The method of claim 9, further comprising exposing the yttrium nitride film to a first treatment plasma to change a property of the film.

13. The method of claim 9, further comprising exposing the silicon nitride film to a second treatment plasma to change a property of the silicon nitride film.

14. The method of claim 9, further comprising repeating the formation of the yttrium nitride film and the silicon nitride film to form a silicon-yttrium nitride film of a predetermined thickness.

15. A method of depositing a film, the method comprising:
   exposing a substrate to a yttrium precursor to form a yttrium species on the substrate, the yttrium precursor comprising a complex with a general formula $YR_1R_2R_3$, where $R_1$, $R_2$ and $R_3$ are independently selected from halides, carbonyl, cyclopentadienes, amines, acac, hfac, amidinates or diazadienes;
   exposing the substrate to a nitrogen reactant to react with the yttrium species on the substrate to form a yttrium nitride film;
   exposing the yttrium nitride film to a silicon precursor to form a silicon-yttrium nitride film on the substrate.

16. The method of claim 15, wherein the nitrogen reactant comprises one or more of nitrogen, ammonia or hydrazine.

17. The method of claim 15, wherein the nitrogen reactant comprises a reactant plasma.

18. The method of claim 15, wherein the silicon precursor comprises a species with a general formula $Si_aX_aR_{2n+2-a}$, $Si(NRR')_aR''_{4-a}$, or a siloxane, where n is 1 to 4, a is 0 to 2n+2, X is a halide and R, R' and R'' are independently selected from H, alkyl or aryl.

19. The method of claim 18, further comprising exposing the silicon-yttrium nitride film on the substrate to a treatment plasma to change a property of the film.

20. The method of claim 19, wherein the treatment plasma comprises one or more of nitrogen, argon, hydrogen, or helium.

* * * * *